United States Patent
O'Brien et al.

(10) Patent No.: US 8,369,804 B2
(45) Date of Patent: Feb. 5, 2013

(54) WIRELESS COMMUNICATION UNIT, SEMICONDUCTOR DEVICE AND POWER CONTROL METHOD THEREFOR

(75) Inventors: Michael O'Brien, Youghal (IE); Denis Dineen, Cork (IE); Patrick Pratt, Mallow (IE)

(73) Assignee: Freescale Semiconductor, Inc., Austin, TX (US)

( * ) Notice: Subject to any disclaimer, the term of this patent is extended or adjusted under 35 U.S.C. 154(b) by 166 days.

(21) Appl. No.: 13/060,549

(22) PCT Filed: Aug. 29, 2008

(86) PCT No.: PCT/IB2008/053500
§ 371 (c)(1),
(2), (4) Date: Feb. 24, 2011

(87) PCT Pub. No.: WO2010/023507
PCT Pub. Date: Mar. 4, 2010

(65) Prior Publication Data
US 2011/0159826 A1   Jun. 30, 2011

(51) Int. Cl.
*H04B 1/04* (2006.01)
*H04B 7/00* (2006.01)
(52) U.S. Cl. ........................ 455/126; 455/522; 455/127.1
(58) Field of Classification Search .................. 455/522, 455/126, 114.3, 115.1, 127.1
See application file for complete search history.

(56) References Cited

U.S. PATENT DOCUMENTS

| | | | |
|---|---|---|---|
| 6,466,772 B1 * | 10/2002 | Rozenblit et al. | 455/126 |
| 6,792,282 B1 * | 9/2004 | Domino et al. | 455/522 |
| 7,409,222 B2 * | 8/2008 | You et al. | 455/522 |
| 7,570,928 B2 * | 8/2009 | Magoon et al. | 455/102 |
| 7,894,772 B2 * | 2/2011 | Aoki | 455/63.1 |
| 7,991,367 B2 * | 8/2011 | Pratt et al. | 455/114.3 |
| 8,014,737 B2 * | 9/2011 | Pratt et al. | 455/127.1 |
| 8,233,859 B2 * | 7/2012 | Yu et al. | 455/127.2 |
| 2004/0176049 A1 | 9/2004 | Nagode et al. | |
| 2009/0289678 A1 | 11/2009 | Pratt et al. | |

FOREIGN PATENT DOCUMENTS

WO    2006/066627 A    6/2006
WO    2006/066628 A    6/2006

OTHER PUBLICATIONS

International Search Report and Written Opinion correlating to PCT/IB2008/053500 dated May 27, 2009.

* cited by examiner

Primary Examiner — Sonny Trinh

(57) ABSTRACT

A wireless communication unit comprises a transmitter comprising a power amplifier, an inner feedback power control loop having a power control logic module comprising loop priming logic module operably coupled to the power amplifier, and a switchable outer digital loop comprising switchable logic module. The loop priming logic module is arranged to set a power reference value for controlling the power amplifier prior to a ramping operation of the power amplifier and the switchable logic module switching the switchable outer digital loop on or off, thereby restricting adverse transient behavior of the power amplifier.

20 Claims, 7 Drawing Sheets

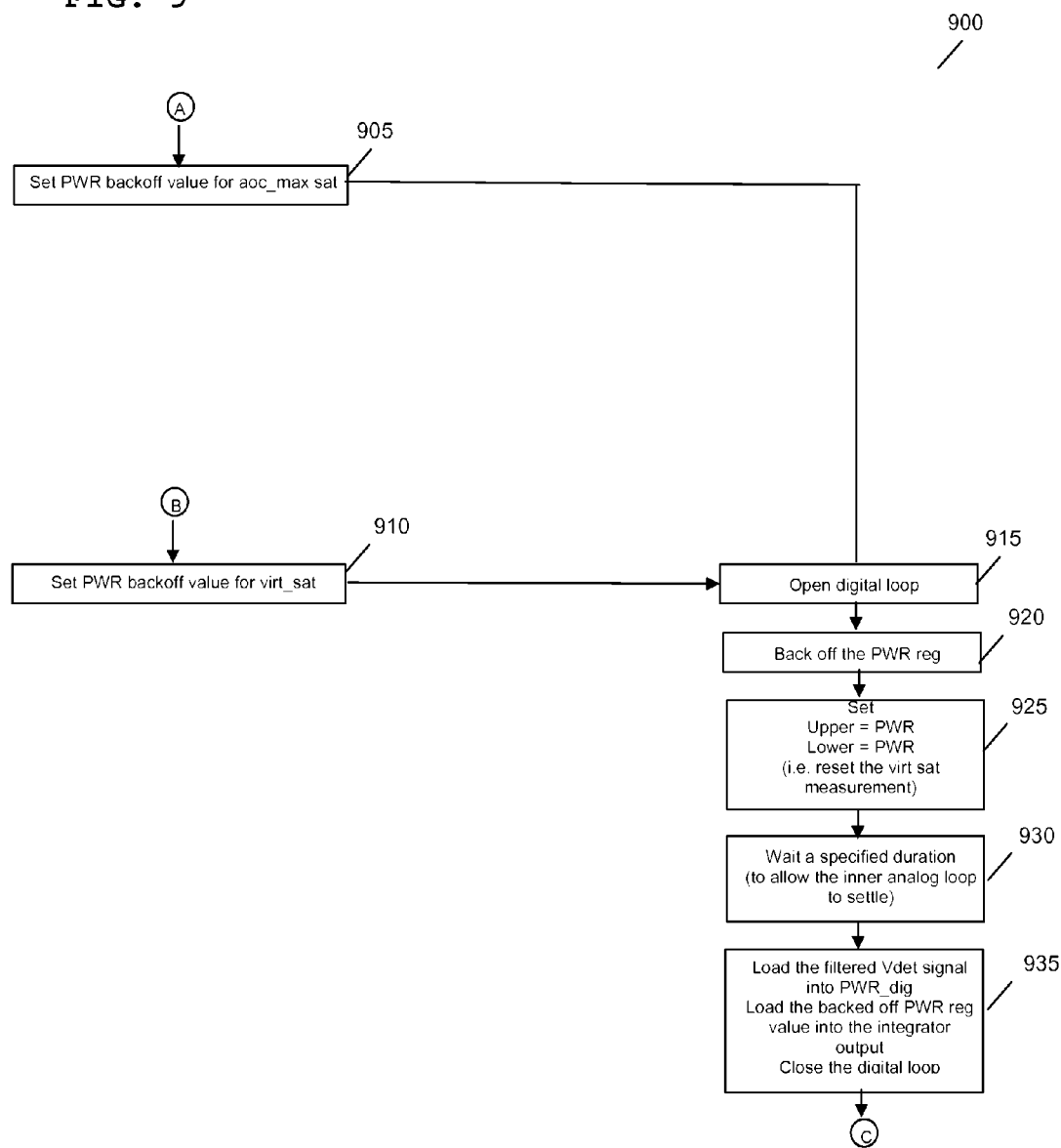

WIRELESS COMMUNICATION UNIT, SEMICONDUCTOR DEVICE AND POWER CONTROL METHOD THEREFOR

FIELD OF THE INVENTION

The field of this invention relates to power control in a wireless communication unit.

BACKGROUND OF THE INVENTION

Wireless communication systems, for example cellular telephony or private mobile radio communication systems, typically provide for radio telecommunication links to be arranged between a plurality of base transceiver stations (BTS) and a plurality of subscriber units. An established harmonised cellular telephony communication system, providing predominantly speech and short-data communication, is the Global System for Mobile Communications (GSM). GSM is often referred to as $2^{nd}$ generation cellular technology.

An enhancement to this cellular technology has been developed, termed the General Packet Radio System (GPRS). GPRS provides packet switched technology on GSM's switched-circuit cellular platform. A yet further enhancement to GSM that has been developed to improve system capacity can be found in the recently standardised Enhanced Data Rate for Global Evolution (EDGE) that encompasses Enhanced GPRS (EGPRS). A still yet further harmonised wireless communication system currently being defined is the universal mobile telecommunication system (UMTS). UMTS is intended to provide a harmonised standard under which cellular radio communication networks and systems will provide enhanced levels of interfacing and compatibility with many other types of communication systems and networks, including fixed communication systems such as the Internet. Due to this increased complexity, as well as the features and services that it supports; UMTS is often referred to as a third generation (3G) cellular communication technology. In UMTS subscriber units are often referred to as user equipment (UE).

Within GSM, two modes of operation (i.e. modulation schemes) may be used, Gaussian Minimum Shift-keyed (GMSK) modulation and 8-phase shift keyed (8-PSK) modulation. GMSK is a constant amplitude phase modulation scheme whilst, for the second generation (2G) standard, 8-PSK incorporates both amplitude and phase modulation.

One feature associated with most present day wireless communication systems allows the transceivers in either or both the base station and/or subscriber unit to adjust their transmission output power to take into account the geographical distance between them. The closer the subscriber unit is to the base transceiver station's (BTS's) transceiver, the less power the subscriber unit and BTS's transceiver are required to transmit, for the transmitted signal to be adequately received and decoded by the other unit. Thus, the transmit power is typically controlled, i.e. set to a level that enables the received signal to be adequately decoded, yet reduced to minimize potential radio frequency (RF) interference. This 'power control' feature saves battery power in the subscriber unit. Initial power settings for the subscriber unit, along with other control information, are set by the information provided on a beacon (control) physical channel for a particular cell.

Furthermore, in a number of wireless communication systems, the effect of fast fading in the communication channel is a known and generally undesirable phenomenon caused by a desired signal arriving at a receiver via a number of different paths. Therefore, fast power control loops are often adopted to rapidly determine and optimize the respective transmit power level.

It is known that within the field of power control techniques, particularly in Gaussian minimum shift keyed (GMSK) systems that employ inner power control loops, a power amplifier (PA) that ramps down from a saturated condition is likely to compromise its switching output radio frequency spectral (ORFS) performance. Here, it is worth clarifying that when the PA is in a saturated condition, the PA output power does not change in response to any change in either the PA control voltage point or input radio frequency, RF, signal level. Thus, the so called 'control slope' (sometimes referred to as 'control gain'), which equates to a ratio of a change in the PA output power level to an input power control to the PA (which in this specific embodiment is the rate of change of the detected power (output of detector logic 330) to the input bias (output of 426), is essentially zero.

As the control slope tends towards zero, for example as the PA saturates, the closed loop gain, in turn, also tends towards zero. As the closed loop gain tends towards zero, the transmitter loop bandwidth collapses and the loop latency (response time) increases. Notably, with zero bandwidth, the transmitter system is unable to ramp down in a controlled manner. Additionally, in practice as the loop is commanded to ramp down at the end of a slot, there is initially no response from the loop and followed by a sudden rapid turn off.

As known in the art, such an uncontrolled ramp down results in a high frequency content in the PA's spectral response is likely to satisfy switching output (power) radio frequency spectral (performance) (ORFS) specifications. Thus, it is necessary to provide a saturation detection scheme to ensure that the output power is backed off to an unsaturated PA region before rampdown commences. Known saturation detection and correction techniques either fail to work well in practice or the proposed implementation adds extra requirements to the PA, thereby making the solution very specific to a given family of PAs or specific PA vendors.

It is known that two distinct types of specific saturations exist within GMSK systems (that have inner loops). The first type of saturation is known as hard saturation, where the PA is unable to deliver the target output power, for example due to the control slope reducing to zero. The second type of saturation is known as soft saturation, where the PA can deliver the required target power, but the response of the system is so sluggish that it causes ramp down switching ORFS problems. Here, the control slope 'tends' towards, but is not yet, zero. In soft saturation, the control slope is low enough that the loop bandwidth is still below a critical threshold value that means the switching ORFS specification is compromised. Therefore, it is a general requirement within communication units to provide two types of saturation detection, namely hard saturation detection and soft saturation detection.

SUMMARY OF THE INVENTION

In accordance with the present invention, there is provided a wireless communication unit, a semiconductor device and method for power control therefor, as defined in the appended claims.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

Examples of embodiment of the present invention will now be described, with reference to the accompanying drawings, in which:

FIG. 8 and FIG. 9 illustrate examples of flowcharts of a saturation detection and correction technique using a power backoff mechanism.

DETAILED DESCRIPTION OF EMBODIMENTS OF THE INVENTION

Embodiments of the invention propose a latency-based saturation detection and correction scheme. Embodiments of the invention acknowledge and utilise the fact that when a closed loop power control loop comprises a PA as the element to be controlled, and the PA is operating close to saturation, the latency of the loop increases significantly. Here, 'latency' may be considered as the time delay from the signal input to the closed loop to the signal being output from the loop (for example the latency from the output of 422 to the output of 330 in FIG. 4), which is representative of the reaction time of the system.

Figure 1:
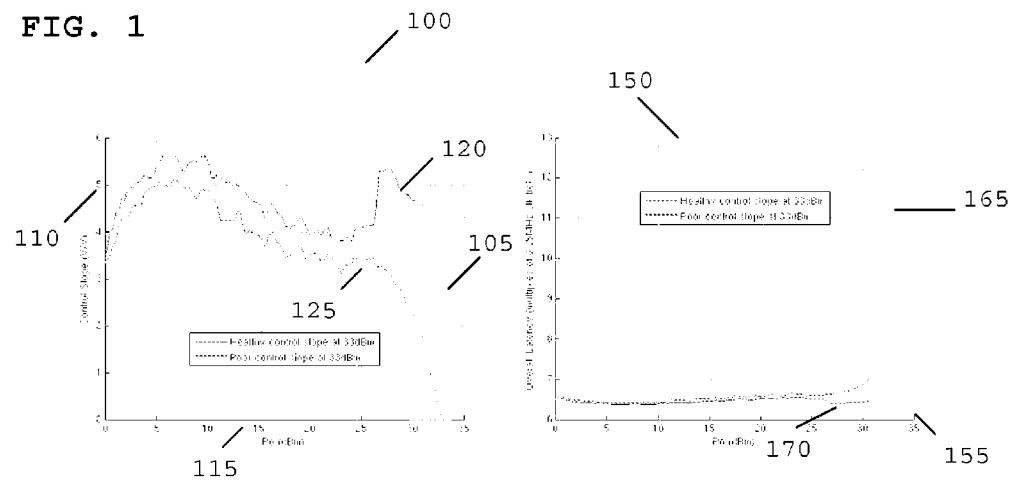
FIG. 1 illustrates an example of a graphical representation of control slope and latency measurements at approaching saturated conditions.

This relationship is illustrated in the graphical representation 100, 150, of control slope and latency measurements at approaching saturated conditions, in FIG. 1. Here, a first graph 100 illustrates control slope 110 versus output power 115. A 'healthy' control slope at +33 dBm, where the control slope is of sufficient magnitude that the loop bandwidth is adequate enough that the loop can ramp down in a controlled manner without compromising switching ORFS specifications, is shown by waveform 120. A 'poor' control slope at +33 dBm, where the control slope is of insufficient magnitude that the loop bandwidth is therefore not adequate enough that the loop can ramp down in a controlled manner and thereby compromises switching ORFS specifications, is shown by waveform 125.

Similarly, a second graph 150 illustrates overall latency (in multiples of 3.25 MHz clock signals) 160 versus output power 155. A healthy control slope at +33 dBm is shown by waveform 170 and a poor control slope at +33 dBm is shown by waveform 165. As shown, waveform 165 indicates that the latency of the inner loop is increasing significantly, thereby indicating that the PA is operating close to saturation. Thus, as shown in FIG. 1, when the PA is non-saturated, the latency of the loop is relatively fixed. If the latency increases, then it is clear that the control slope is no longer sufficient, that the PA is saturating and therefore a small power backoff is initiated.

Figure 2:
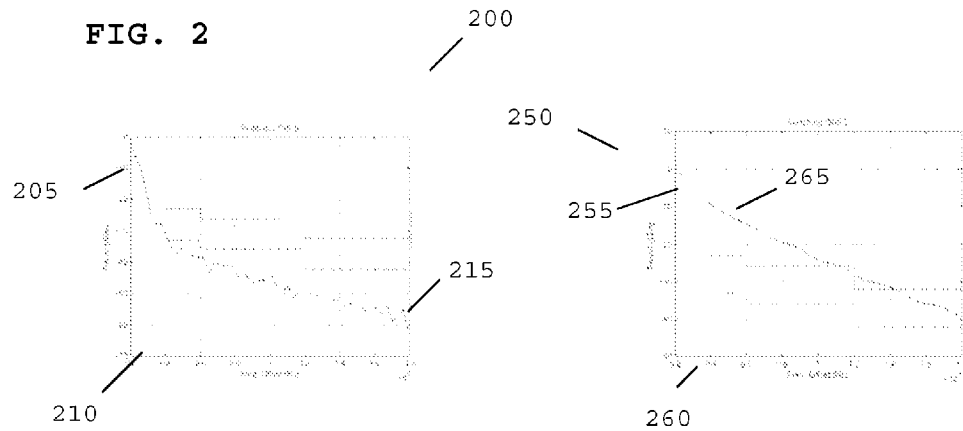
FIG. 2 illustrates an example of a graphical representation of switching OFRS behaviour at approaching saturated conditions.

Referring now to FIG. 2, switching ORFS behaviour for both latency cases (again with a target output power of +33 dBm) is illustrated. The first graph 200 in FIG. 2 illustrates the power 205 versus frequency offset 210 (offset with respect to the centre frequency or carrier frequency of the radio frequency signal being amplified by the PA) with a healthy loop latency 215. Here, as shown, the ORFS performance meets the specification with ample margin, the PA is not saturated, the loop has adequate control slope and the bandwidth is able to ramp down in a controlled manner. The second graph 250 in FIG. 2 illustrates the power 255 versus frequency offset 260 with a large inner loop latency 265. As shown, the second graph highlights in waveform 265 that a large latency of the loop consequently provides a performance that fails to meet the ORFS switching specification, where the PA is saturated, the loop does not have adequate control slope and the bandwidth is therefore unable to ramp down in a controlled manner.

Figure 3:
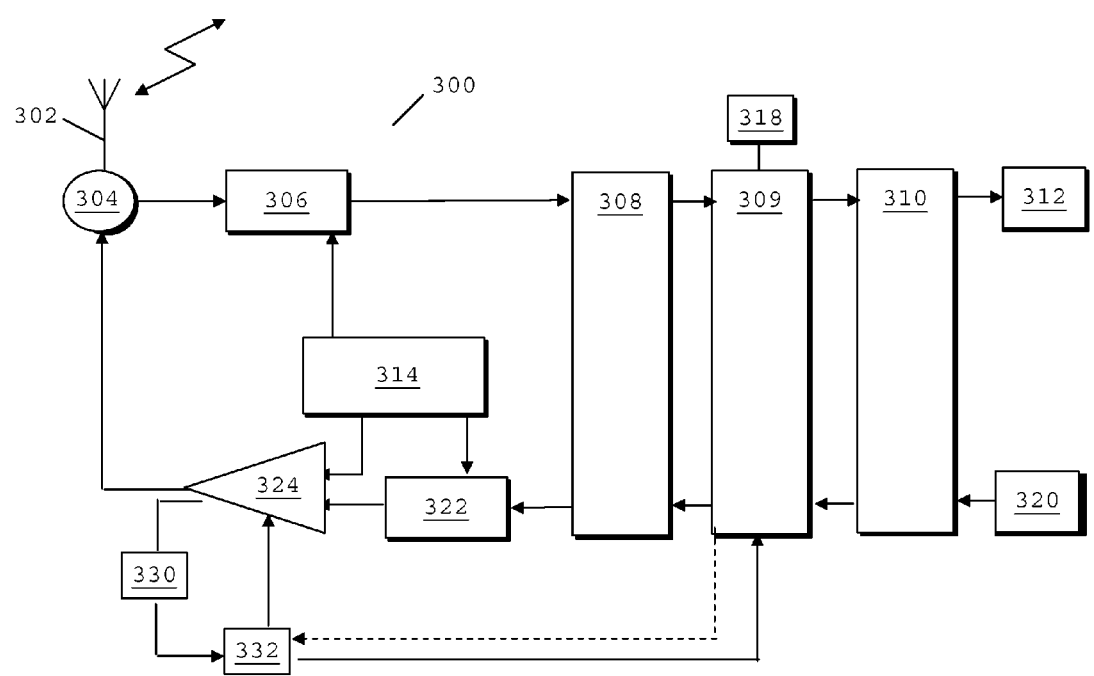
FIG. 3 illustrates an example of a functional block diagram of a subscriber unit, adapted in accordance with embodiments of the invention.

Referring now to FIG. 3, a block diagram of a wireless subscriber communication unit, sometimes referred to as user equipment (UE) 300; adapted to support examples of embodiments of the invention, is illustrated. The wireless subscriber communication unit 300 contains an antenna 302 preferably coupled to a duplex filter or antenna switch 304 that provides isolation between receive and transmit chains within subscriber unit 300.

For completeness, the receiver chain is described and includes receiver front-end circuit 306 (effectively providing reception, filtering and intermediate or base-band frequency conversion). The receiver front-end circuit 306 receives signal transmissions from another wireless subscriber communication unit, for example its associated base transceiver station (BTS) or direct from another wireless subscriber communication unit. The receiver front-end circuit 306 is serially coupled to a signal processing logic module (generally realised by a digital signal processor (DSP)) 308. The signal processing logic module 308 performs de-interleaving, signal demodulation, error correction, data formatting, etc. of the received signal. Recovered information from the signal processing logic module 308 is serially coupled to a power control processing logic module 309, which extracts pertinent power control information from the received and decoded beacon signal and interprets the information to determine an appropriate transmit output level for the subscriber unit's transmissions.

As known in the art, received signals that have been processed by the signal processing logic module 308 are typically input to a baseband-processing logic module 310. The baseband processing logic module 310 takes the received information formatted in a suitable manner and sends it to an output device 312, such as an audio speaker or liquid crystal display or visual display unit (VDU). A controller logic module 314 controls the information flow and operational state of each circuit/element/logic module.

A timer 318 is preferably operably coupled to the numerous signal processing logic modules to provide synchronisation in both the signal recovery and signal generation processes.

As regards the transmit chain, this essentially includes an input device 320, such as a microphone or keypad, coupled in series through baseband-processing logic module 310, a power control processing logic module 309, signal processing logic module 308, transmitter/modulation circuitry 322 and a power amplifier 324. The signal processing logic module 308, transmitter/modulation circuitry 322 and the power amplifier 324 are operationally responsive to the controller logic module 314, with an output from the power amplifier 324 coupled to the duplex filter or antenna switch 304, as known in the art.

The transmit chain in wireless subscriber communication unit 300 takes the baseband signal from input device 320 and converts this input signal into a signal whose level can be baseband adjusted by the power control processing logic module 309. The power control processing logic module 309 forwards the amplitude-adjusted signal to the signal processing logic module 308, where it is encoded for transmission by transmit/modulation circuitry 322, thereafter amplified by power amplifier 324, and radiated from antenna 302.

In different embodiments of the invention, it is envisaged that the signal processing logic module 308, power control processing logic module 309 and baseband processing logic module 310 may be provided within the same physical signal-processing integrated device.

Clearly, the adjustment of the transmit output power can be effected by any amplitude or attenuation means in the transmit chain, and the above baseband adjustment is described as one example only.

Notably, in accordance with embodiments of the invention, the transmitter chain employs a power control feature, whereby a sample of the transmitted signal is fed back to a power control logic module 332 via a coupler and a log detector 330. The power control logic module 332 is also responsive to the power control processing logic module 309.

The signal processing logic module 308 in the transmit chain may be implemented as distinct from the processor in the receive chain. Alternatively, a single processor may be used to implement processing of both transmit and receive signals, as shown in FIG. 3. Furthermore, the various components within the wireless subscriber communication unit 300 can be realised in discrete or integrated component form.

Furthermore, in embodiments of the invention, the majority of the power control logic modules may be implemented in a digital signal processor (DSP). However, it is within the contemplation of the invention that the power control processor circuitry described in the above embodiments can be embodied in any suitable form of software, firmware and/or hardware.

The various components within the wireless subscriber communication unit 300 are realised in this embodiment in integrated component form. Of course, in other embodiments, they may be realized in discrete form, or a mixture of integrated components and discrete components, or indeed any other suitable form.

Figure 4:
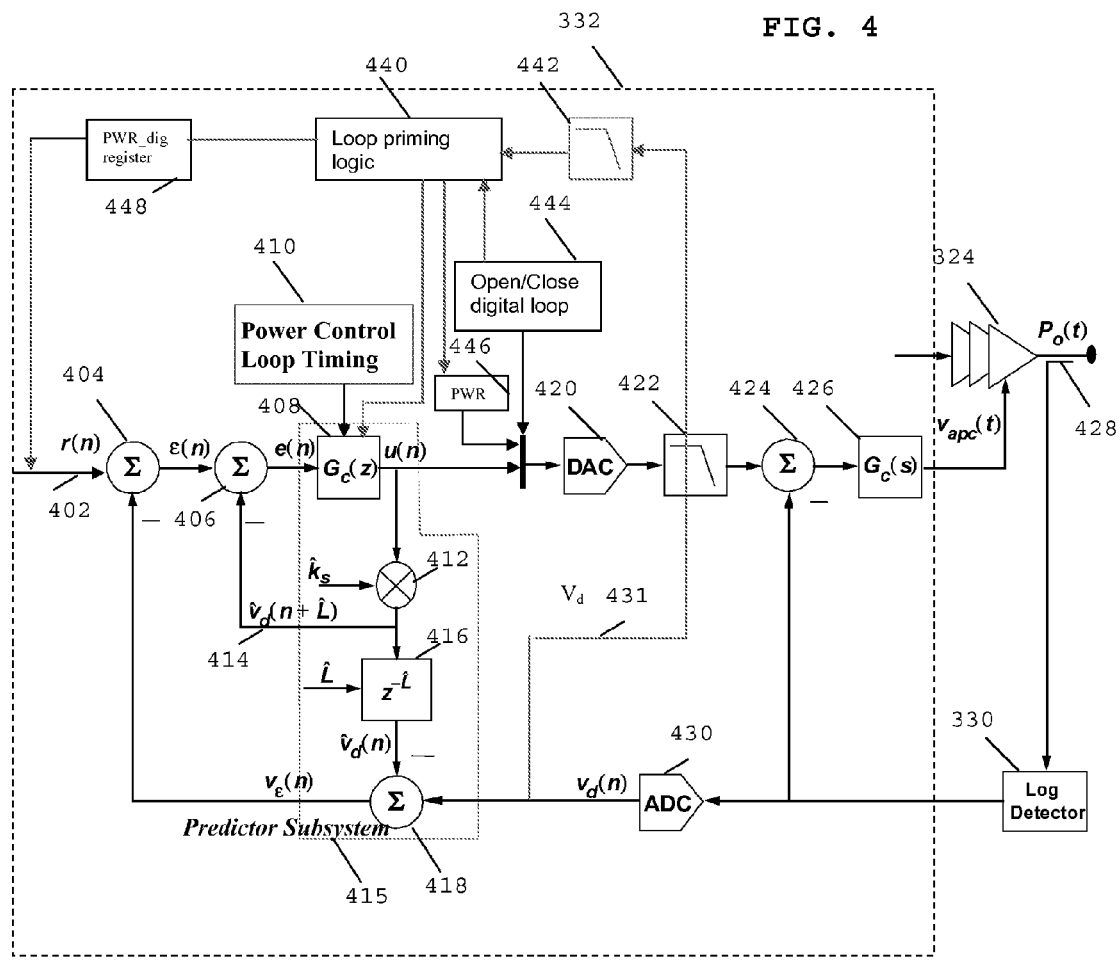
FIG. 4 illustrates an example of a functional block diagram of a subscriber unit transmitter having a power control function and a Smith predictor sub-system.

Referring now to FIG. 4, an example of a logic block diagram of a wireless subscriber communication unit of FIG. 3 is illustrated. It is envisaged that the teaching herein described may be applied in any transmitter architecture having a PA control loop. As an example only, FIG. 4 is illustrated as a dual loop architecture having a Smith predictor-based sub-system, for example located within the power control logic module 332 of a wireless subscriber communication unit of FIG. 3. Notably, in this example of a architecture, a predictor-based sub-system has been incorporated to indirectly measure the latency of the system from the output of logic 422 to the output of detector logic module 330 and from this, action corrective action can take place.

The power control logic module 332 comprises an analog inner feedback loop, which can be used, for example, for power amplifier control when the subscriber unit is operating in a Gaussian Minimum Shift Keyed (GMSK) mode.

The feedback loop preferably comprises a log-detector 330 that allows the feedback loop to be closed at low (<−5 dBm) power levels. In this scenario, the inner loop has been incorporated to desensitize the system from 'large' variations in the control-slope of the power control signal.

In particular, the power control logic module 332 comprises a predictor sub-system and in an example of a embodiment a simplified and modified Smith predictor sub-system. A well known arrangement for a Smith predictor is one that includes only a delay line and a gain block to replicate/represent the system elements and components of the feedback system. Furthermore, the robustness of the system is significantly enhanced by adopting a simplified and modified version of the Smith predictor. The simplification of the predictor is facilitated by the use of a multiloop control strategy where a high gain, low latency inner loop is placed immediately around the PA and detector. This allows the predictor to be simplified to just a pure gain and pure delay; modelling, respectively, the gain and delay through the inner loop. The predictor sub-system is comprised of a gain stage 412 and a digital delay line 416. An estimate of the control slope is multiplied by the controller output. This forms the loop latency free prediction, which is delayed using a digital delay line block 416. It is noteworthy that, by virtue of the inner loop, the gain may simplify to unity, thereby allowing the multiplier to be removed, as described in PCT/EP2004/053690 by the same Applicant as the present invention: Freescale Semiconductor Inc.

Notably, the digital control system incorporates two feedback loops: an inner loop (comprising in one embodiment summing junction 406, controller logic module 408 and gain stage 412) that is closed using the estimated or predicted version of the latency free detector voltage, and an outer loop (comprising summing junction 404, summing junction 418, delay 416 and summing junction 402) that is closed using a modelling or predictor error.

The inner digital loop can be understood in terms of ensuring satisfactory ramping behaviour. Intuitively, as this inner loop is latency free, the loop gain and bandwidth can be increased to improve system robustness. The outer digital loop can be understood in terms of rejecting disturbances and predictor/modelling errors.

In accordance with embodiments of the invention, saturation within the inner loop may be measured in terms of inner loop latency, as well as, or instead of, control slope. In this scenario, in accordance with one embodiment of the invention, when saturation is detected, an additional outer digital loop (namely in addition to, in this embodiment, the inner loop and outer Smith predictor-based digital loop) which is arranged to override, prime, configure and/or adjust at least one parameter associated with the outer digital loop depending on the level of saturation detected. In the context of this example of a embodiment, the additional outer digital loop may be considered as the block logic module 440 providing updated references for the inner loop and outer Smith predictor-based digital loop. This additional outer digital loop is arranged to immediately override the reference to the inner loop, to avoid the transmitter exhibiting a poor ORFS switching performance and adverse transient behaviour.

Notably, in an example of a embodiment of the invention, low-level perturbations are then added to the outer digital loop reference 402 when both loops are engaged, for example when the PA is not saturated. The response of the Smith predictor loop to these perturbations is then used to determine the latency of the system. If the latency is determined as being above a threshold and therefore sufficiently large, when measured at the output of logic block 408, then the PA is deemed to be in saturation and a power backoff is considered, and potentially implemented.

At the instant when the outer digital loop is closed, it is assumed that ramp up has completed and the system is operating in the 'active' part of the slot. The saturation detection mechanism must be able to measure both hard saturation and soft saturation. By monitoring the output of logic block 408 with the digital loop closed, it can be determined if the PA is operating in a hard saturation, soft saturation or a non-saturated region. As a result of this determination, corrective measures may be taken, for example simply by backing off the target power if the PA is in saturation.

For a hard saturation case, once the outer digital loop is closed, the output of logic block 408 will ramp downwards toward a settled point, and such a response is unique to hard saturation. For soft saturation to be measured, perturbations are added to the input signal 402. In this manner, the response to the perturbations may be measured at the output of logic block 408 that determine whether the PA is in soft saturation. For example, transients will be produced at the output of logic block 408 in response to the perturbations and if these peak-to-peak transients are greater than a pre-determined threshold, then it may be concluded that the PA is in soft saturation. Otherwise, if these peak-to-peak transients are not greater than a pre-determined threshold, then it may be concluded that the PA is in a non-saturated region.

If a power backoff is instructed, then the outer digital loop is disabled and the power backoff arranged to occur via the re-installed inner loop reference. Once the backoff has been completed and the inner loop has settled, the outer digital loop is re-primed and re-engaged, in the event that further saturation detection and correction is required.

In this manner, with the inclusion of an outer digital loop specifically for latency detection and saturation detection and correction, the effect of backoff transients, as seen in the implementation of prior art systems, are removed. Furthermore, for wireless communication manufacturers, operation stipulations to PA vendors can be relaxed, in the sense that only the detector output is required. In addition, no other internal nodes to a PA semiconductor device are required to support this mode of operation.

In one example of a embodiment of the invention, both the inner loop and outer digital loop are primed when switching from closed loop operation to open loop operation (and vice versa) to remove any resultant transients. Latency detection is used for saturation detection, by measuring virtual and hard saturation.

Referring back to FIG. 4, in an example of a embodiment of the invention a power activity detection mechanism with a self-activating inner and outer loop in a power amplifier is arranged to use a log detector 330. Thus, an analogue inner loop comprises a low-pass (input ramp) filter 422 receiving an analogue output from the digital-to-analogue convertor (DAC) 420. The filter outputs the transmit signal to a summing junction 424. Typically, the nonlinear, log nature of the log detector 330 requires a 'pre-distortion' log function, in the reference ramp generation circuit, in order to avoid switching transient problems at high power. The detected voltage will then track the log of the reference while the output power will actually track the antilog or linear profile of the reference, and thus follow the true profile of the reference ramp (such as a ½-raised cosine reference, for example).

In a GMSK mode of operation, this pre-distortion function of the reference is not essential, as the inner loop tends to linearise the effect of the log detector for power levelling, whereas the predistortion function is required for rampup switching transients.

In an example of a embodiment, the digital loop remains open until the rampup operation has completed. Thus, in this embodiment, the inner loop provides initial power leveling, namely loop regulation of the average output power of the PA to a set value. In this manner, the digital loop is switched on during the slot. There are two registers, PWR 446, which is a reference for the inner analog loop, and PWR_dig register 448, which is a reference for the outer digital loop. During ramp up, the outer digital loop is open and the inner analog loop is controlling the output power (via the reference PWR 446). After ramp up (but early into the slot), priming occurs, i.e. PWR_dig 448 is loaded with the output of 442 and the integrator in 408 is loaded with register PWR 446. Following this, logic module 444 commands the outer digital loop to close, which means that the outer digital loop is now performing the control and also performing the latency measurement. No transients now occur when switching between use of the outer digital loop and both the outer digital loop and the inner analog loop. The outer digital loop is never switched off, thereby ensuring that the inner analog loop is now performing closed loop control again until a saturation event is detected or if rampdown is initiated.

In an example of a embodiment, the digital loop is switched off using loop switch logic 444 some time after rampup has completed, and when saturation is detected. The PWR_dig register 448 may then be loaded with the appropriate value. The outer digital loop is then switched 'off' and no transients occur in the output power envelope.

A PA with an inner loop has large latency when the PA is delivering power close to saturation. The outer digital loop is Smith predictor-based, which performs an estimate of the latency. A perturbation is added to the PWR_dig reference 448 applied to the input signal 402. If the PA is then determined as being in a non-saturated condition, as determined by the Smith predictor, then the latency estimate of the outer digital loop closely matches the actual latency of the system. This causes minimal transient response of the control signal to the perturbations. If the PA is delivering power close to saturation, or if the PA is chronically saturated, then the latency estimate of the outer digital loop no longer matches the actual latency of the system.

However, the latter case and in accordance with embodiments of the invention, if the PA is determined as being hard saturated then a control signal applied to the PA is arranged to ramp down until regulation of the outer digital loop occurs. This type of response can be used to trigger a hard saturation event. If the PA is in a soft saturation condition then the response of the control signal to the perturbations may cause severe transient effects.

Control logic module 332 further comprises loop priming logic 440 that is arranged to prime the transmitter architecture under two distinct conditions;

(i) when the outer digital loop is about to close, and
 (ii) when the outer digital loop is about to open.

In (i), just before the digital loop is closed (for example just after ramp up and into the 'active' part of the slot where the output power has a constant envelope or when a saturation event had been dealt with that caused the outer loop to open, and a backoff to occur or a backoff had occurred and the outer digital loop is ready to close again to continuously monitor saturation), the outer digital loop is primed. Loop priming logic 440 is arranged to ensure that no transients occur at the instant when the outer digital loop is switched 'on'. Priming, in this context, means that the PWR_dig reference 448 is loaded with a filtered version of Vd(n) 431, where the filter 442 removes residual noise. Furthermore, the integrator in 408 is again loaded with the backed off value of PWR 446, which is necessary for the priming.

Logic block 408 (identified as Gc(s)) has an internal integrator (not shown) that requires an initial start-up condition. Hence, this initial start-up condition is loaded with a 'PWR' level 446, programmed by loop priming logic 440. By loading both of these values into the transmitter architecture, the outer digital loop is primed, which means that the loop can be switched 'on' with negligible transients.

Once the outer digital loop has been switched 'on', the saturation detection mechanism can be commenced. This will typically occur not long after rampup. By monitoring the output of logic block 408, it can be determined what type of saturation exists. If hard saturation occurs, the output of logic block 408 will reduce naturally in a relatively linear fashion to a steady-state point. If node reduces from its starting point by a value that is greater than a threshold, then hard saturation occurs and corrective action can be taken.

The mechanism with soft saturation is slightly different, in that perturbations are added to the input signal 402, and the outer digital loop is closed using loop switch logic 444. By monitoring the response of these perturbations at the output of logic block 408 (whose response will be also oscillatory in nature around a dc point), it can be determined whether the system is operating in a soft saturation region. If the peak-to-peak value at the output of logic block 408 is large, then it can be concluded that the system is operating in soft saturation and corrective action can be taken.

In one example of a embodiment, the peak to peak measurements may be determined by using two registers (for example an 'UPPER' register and a 'LOWER' register). Both of these registers may be initially set to a PWR level 446, namely the starting point for the output of logic block 408 once the loop is closed. If the instantaneous value of logic block 408 output is greater than 'UPPER' then the 'UPPER' register may be re-loaded with this 'UPPER' value. If the instantaneous value of logic block 408 output is less than 'LOWER' then the 'LOWER' register may be re-loaded with this 'LOWER' value. The peak to peak response of the system to the perturbations may then be given by a determination of the 'UPPER' minus 'LOWER' value, and this can be used to determine if soft saturation occurs.

New soft saturation measurements can be taken regularly during a slot and these measurements reset at the start of each pulse. Thus, the peak-to-peak measurement (UPPER-LOWER) must be reset to '0' at the start of each pulse or after a power backoff has occurred. Hence, once the rising edge of a pulse occurs, the value at the output of logic block 408 is latched and both 'UPPER' and 'LOWER' registers are loaded with this value so that their difference is now zero and a new set of peak-to-peak (or soft saturation) measurements can be taken from a new starting point.

Thus, in this manner, the controller logic module, e.g. controller logic module 332 of FIG. 3, is adapted to implement an algorithm to provide robust protection against PA saturation, for example in a wireless subscriber communication unit that supports GMSK. The algorithm, in one embodiment, comprises code to enable Smith predictor circuitry in the outer digital loop to estimate latency of the inner loop of the PA and, thus, saturation. In this regard, it is noteworthy that control slope and latency of the inner loop are inherently related. If the controller logic module determines that the inner loop latency is too large then a power backoff operation is performed. Thus, in this regard, it is envisaged that either a latency estimate or a control slope estimate may be used to trigger a power target backoff.

In a controlled, well-functioning PA, any determined amplitude response due to the introduction of the perturbations into the input signal will be determined as being minimal. Hence, with any minor variation of the PA's amplitude response, it is understood that the PA is operating in a virtual saturation mode. If a large latency of the PA occurs, in measuring the output of logic block 408 in FIG. 4, the delay estimate in the Smith predictor no longer accurately matches the latency of the system. For example, in one example of a embodiment, the latency of an unsaturated system may be specified by programming an appropriate value in delay element 416. If the appropriate value matches the actual latency of the system, then the responses to the perturbations at the output of logic block 408 will have small peak-to-peak amplitudes. However, if the PA is in soft saturation and the latency from the output of logic blocks 408 to 430 is thus larger than the estimate specified by the appropriate value, then the peak-to-peak responses to the perturbations at the output of logic block 408 is large. Hence, the system is deemed to be in a soft saturation condition and, a poor transient behaviour results. This means that a power target backoff may be instructed, thereby further moving the PA out of its saturation region. This continues to occur until the PA is operating fully out of the saturation region.

Once rampup has occurred and the PA is delivering a constant power envelope then, for example, in a hard saturated condition, the PA may be only able to deliver 31 dBm in contrast to a 33 dBm target output power level. As previously mentioned, the outer digital loop has been primed and is then closed, which facilitates the commencing of a hard saturation measurement. The natural response of the system, in this scenario, is to ramp the output of logic block 408 negatively to a steady-state point. If this is allowed to reduce naturally to its steady-state point, without taking corrective action, then strictly speaking the PA will move out of its hard-saturated region (and likely enter a soft saturated region). The result of allowing the PA to move into a soft saturation region is that severe transients may occur around the steady-state point. These transients are also likely to break the governing requisite PA specifications, primarily the power envelope (Power versus Time (PvT) specification.

However, due to the fact that the output of logic block 408 is reducing, it can be concluded long before it reaches its steady-state point that the PA is hard-saturated and corrective action can be taken immediately. This corrective action will be to generate a hard saturation event and command a power backoff that takes the PA beyond a soft saturation point.

To reiterate, three very distinct responses occur for the three different cases, making the saturation type easy to determine. Note that the system comes naturally out of hard saturation, but (for various reasons) a backoff mechanism is still specified for hard saturation, as described below.

Backing off the reference digital PWR when the outer digital loop is enabled may have a detrimental impact on the output power transients. The reason for this is that the backoff occurs when the PA is in a soft saturation condition. In this condition, the latency of the loop is much larger than the latency estimate of the Smith predictor. Backing off the target power of the outer digital loop for a poorly modelled latency estimate will cause output power transients that can break PvT specifications.

A skilled artisan will appreciate that the above circuit configuration is one example of a circuit that can employ the inventive concept described herein, and that may other circuit configurations can also benefit therefrom.

Figure 5:
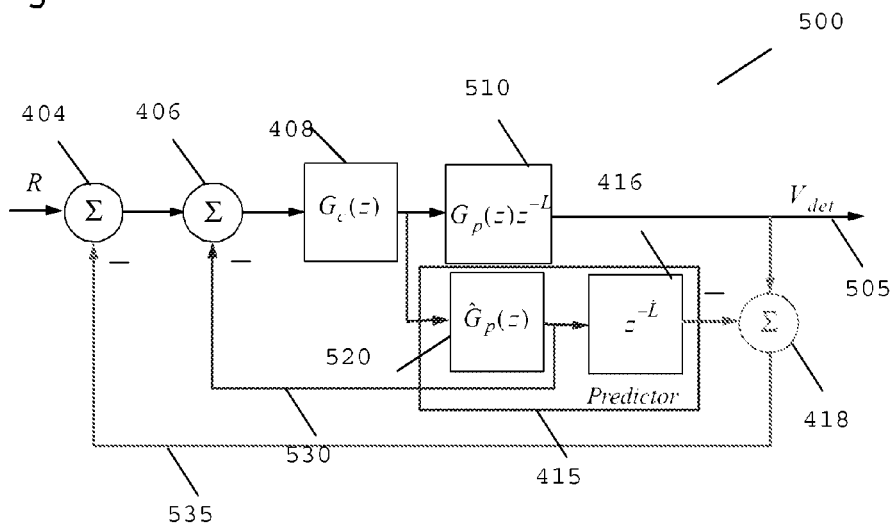
FIG. 5 illustrates an example of a functional block diagram of a Smith predictor sub-system.

Referring now to FIG. 5, FIG. 5 illustrates how an example of a embodiment may effectively operate with a Smith predictor-based architecture (as illustrated in FIG. 4), when the digital loop is closed. The specifics of the generic predictor 415, controller 408 and associated loop characteristics may be as disclosed in WO2006066627, by the same Applicant, and are thus incorporated herein by reference, without replication, for clarity purposes only.

As mentioned therein, the performance of the loop depends primarily on the accuracy of the predictor. The better the accuracy of the predictor, the more the loop bandwidth can be extended, whilst maintaining adequate stability margins. Consequently, the system robustness is improved.

The following is the sequence of events that occurs for the saturation detection method that also provides power levelling, as set by the PWR_dig register 448. After rampup has completed (and some time thereafter in the active part of the slot), the output of logic module 442 is latched into the PWR_dig register 448. Note that the detected signal 431 is presented via a sigma-delta modulator (SDM) ADC meaning that some filtering of the received signal is required for a more accurate representation of the detected signal. Thereafter, the PWR_dig register 448 is used as the reference for the outer digital loop. The integrator (not shown) is loaded with the PWR value 446. The outer digital loop is then enabled. A perturbation is added to the input signal 402 via the PWR_dig register 448, in order to measure soft saturation. The outer digital loop is now controlling the power levelling operation. However, the system will still transmit at the identical output power as before.

Referring now to FIG. 5, the input signal 'R' equates to PWR_dig 448 from FIG. 4. The inner analog loop is fully encompassed in 510. During rampup, the connection between logic module 408 and 510 is broken and the input to 510 is replaced with a fixed reference (PWR), such as PWR 446 from FIG. 4. After rampup, 'R' is loaded with a filtered version of signal 505 and the integrator in logic module 408 is loaded with PWR 446 (for priming) and the connection between logic module 408 and 510 is restored, thereby enabling the outer digital loop. Perturbations are added to the input signal 'R' to measure soft saturation and while the outer digital loop is closed, the output of logic module 408 is monitored for saturation. If a saturation event is detected, the connection between logic module 408 and 510 is again broken, the original PWR value is backed off and is driven as an input reference to 510 (i.e. priming occurs in the other direction). After a finite time, allowing the loop in 510 to settle, the outer digital loop will be primed again. In this regard, the PWR_dig value is loaded with a filtered version of 505 and the integrator in 408 is now loaded with the backed off version of PWR. The connection between logic module 408 and 510 is then re-engaged.

Figure 6:
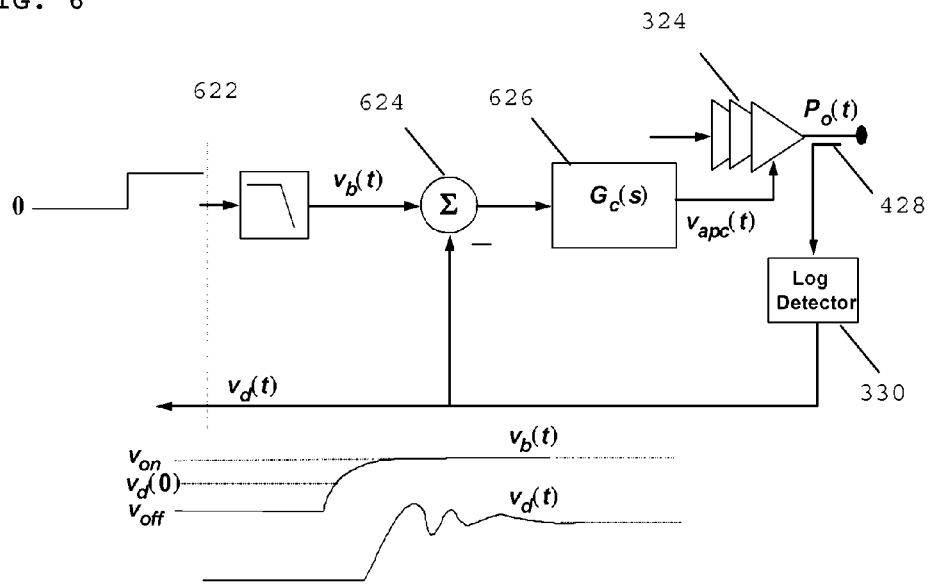
FIG. 6 shows an example of a block schematic diagram and associated signal characteristics of an inner loop.

Referring now to FIG. 6, FIG. 6 illustrates how an example of a embodiment may effectively operate when the digital loop is open. The inner analog loop in FIG. 6 may fully reside in the analogue RF domain, for example there is no digital element to it except the DAC input at the reference. The input at the reference provides a reference waveform, $v_b(t)$. The controller logic module 626 will regulate the bias voltage $v_{apc}(t)$ to drive the output power so that the output of log detector 330 tracks 'R'. In this instance, when the outer digital loop is open, then the output power is controlled simply by choosing the appropriate value for PWR.

In accordance with an example of a embodiment, once saturation has been detected, the output power of the PA is arranged to ramp down from a healthy operating condition, in order to minimise ramp down switching ORFS effects. In this manner, a switchable outer digital loop is used, which is switched off during power backoff, in contrast to the prior art where the outer digital loop was used for both power leveling and saturation detection. In this example of a embodiment, the outer digital loop is used only for saturation detection. It is noteworthy that the inner analog loop provides the main power levelling but, when the outer digital loop is switched 'on', the outer digital loop just maintains power levelling.

In one example of a embodiment, both the outer digital loop and the inner loop are primed to facilitate switching between them both before and after saturation events. In this example of a embodiment, priming is performed in both directions (i.e. when switching 'on' the outer digital loop and when switching 'off' the outer digital loop). Switching between these two loops is performed relatively seamlessly and without significant transients, primarily due to the fact that the inner loop's reference voltage and the outer digital loop's reference voltage are independently controlled. Depending upon the prevalent operating conditions, one of these loops will be providing the power levelling of the PA. The outer digital loop is switched on some time after rampup to once again provide saturation detection and correction functionality.

In one example of a embodiment of the invention, it is envisaged that the controller logic module 332 may apply a limit on the maximum backoff level that can be made to the PA's power regulator. Here, during the active part of the slot, there is typically a requirement that the instantaneous power does not move outside a limit around the average power (referred to as Power versus Time (PvT) specification). If the total amount that the power is backed off during any arbitrary becomes excessively large, then PvT may be compromised. For this reason, in this example of a embodiment, a constraint on the total backoff that can occur in any arbitrary slot may be imposed by the controller logic module 332.

In one example of a embodiment of the invention, it is envisaged that the controller logic module may be arranged to ensure that no backoffs are allowed whilst the reference voltages for the respective inner loop and the outer digital loop are being reset. If backoffs are allowed while the loop is priming (either to open or close the digital loop), then it is possible that intermediate signals may fluctuate that would inadvertently backoff the power and may therefore either break the saturation mechanism or adversely influence the priming mechanism.

In one example of a embodiment of the invention, it is envisaged that the controller logic module may apply different sized backoff steps dependent upon the type of saturation detected, for example for hard saturation or for soft saturation. In this example of a embodiment, both saturation types signify distinctly different saturation behaviours in the PA, and both may be configured to ultimately, and independently trigger an independent power backoff. In this manner, depending upon which type of saturation is detected, a power backoff of different magnitude may be implemented. It is also useful to ensure that when loading outer digital loop reference voltage after a saturation event has been detected, that the updating reference value is less than the existing reference value, thereby ensuring that a genuine power backoff is applied.

Figure 7:
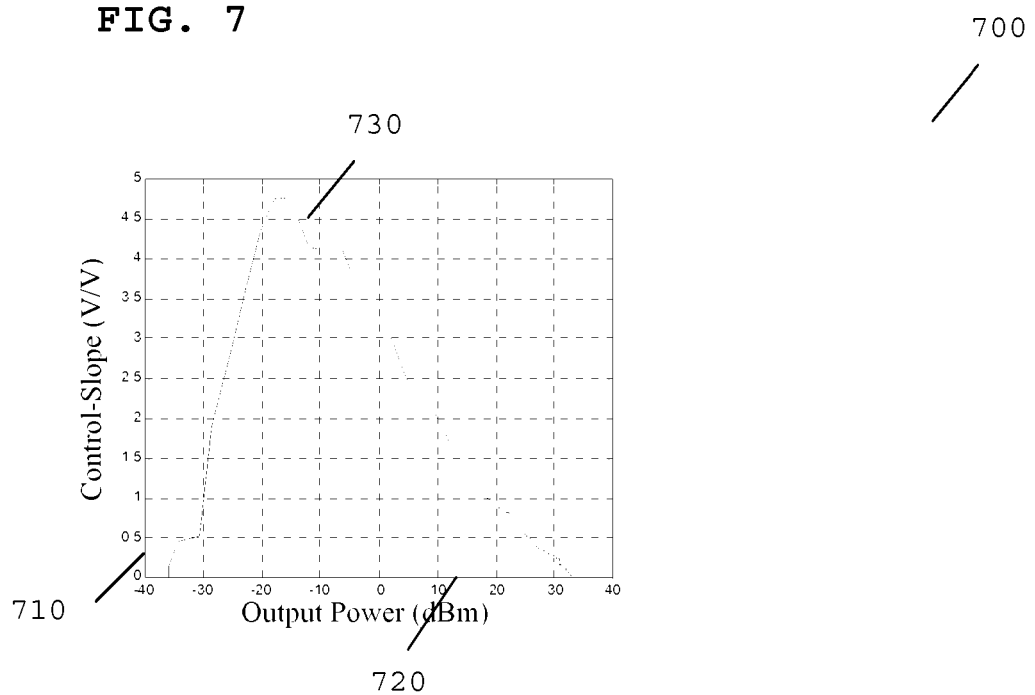
FIG. 7 illustrates an example of a graph of control slope versus output power for a power amplifier combined with a log detector.

The accompanying plot in FIG. 7 shows a graph 700 of an example control-slope 710 versus output power (in dBm) 720 for a PA combined with a log detector. Closing the loop over the range of −10 dBm to 33 dBm can present a gain variation of around 60 dB. The predictor alone is unable to offer sufficient robustness to such a large variation in gain. A single gain setting of the digital controller would not be able to satisfy PvT requirements. For instance, at high power where the control-slope falls off, a 'high' controller gain setting is required to maintain the loop bandwidth and ensure satisfactory PvT during ramp-down. Conversely, at lower power, the controller gain has to be reduced. Otherwise, the 'high' control-slope 730 could cause ringing and again failure of the PvT.

Figure 8:
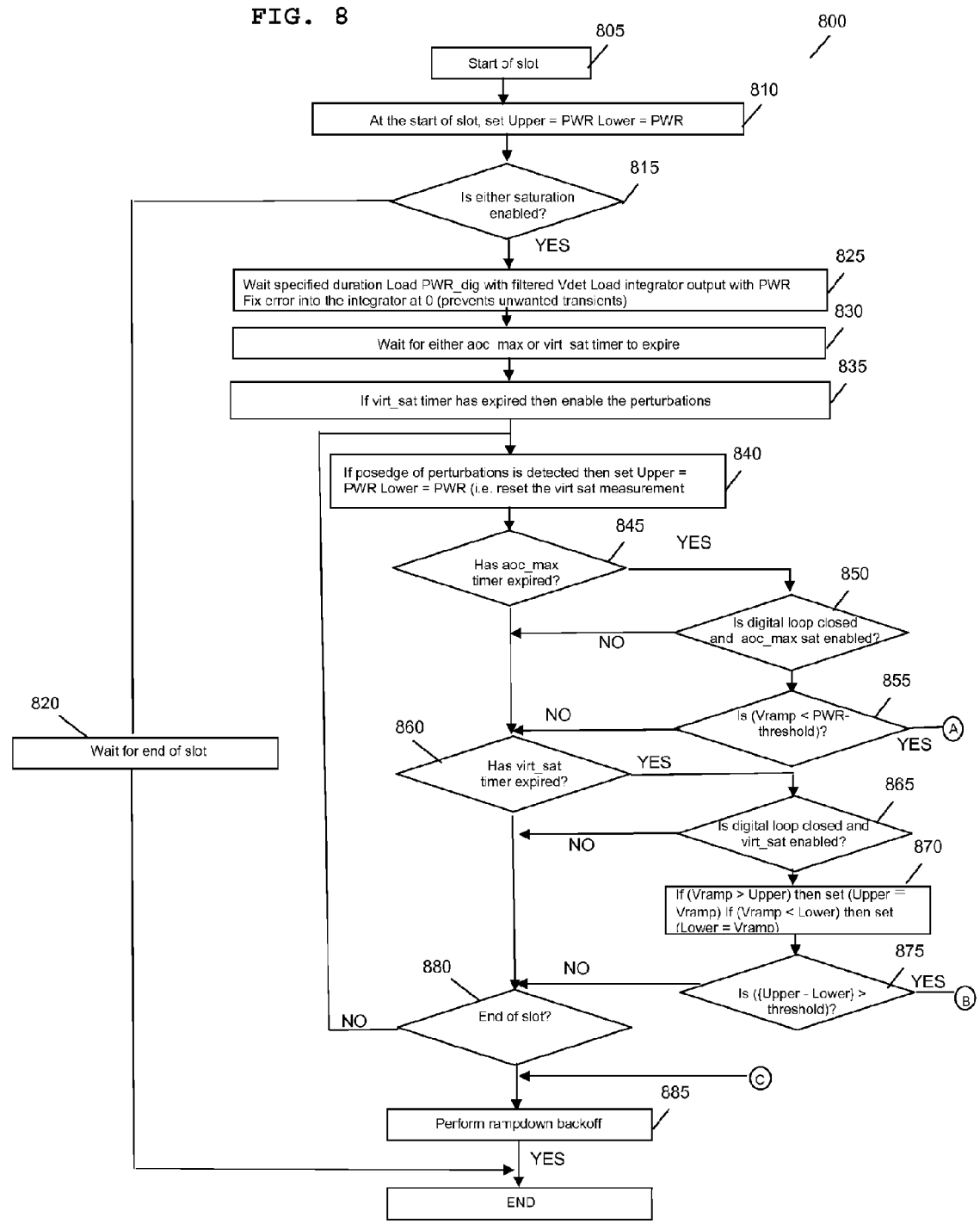

Referring now to FIG. 8 and FIG. 9, flowcharts 800 and 900 illustrate a method of saturation detection and correction using a power backoff mechanism, in accordance with embodiments of the invention. The method starts with identifying a start of a transmit slot, as shown in step 805, At the start of the slot, maximum and minimum output power values are set as shown in step 810. This particular aspect of the method is specific to the soft saturation mode of operation, according to one example of a embodiment, where the peak-to-peak transients are measured. When the outer digital loop is closed (for example for the first time), then an integrator in logic block 408 of FIG. 4, will be loaded with a pre-determined initial power value. To measure latency, this example of a method is only concerned with the peak-to-peak value at the output of logic block 408 of FIG. 4. For example, two dedicated registers—'UPPER' and 'LOWER'—are loaded with the initial power (PWR) value. Note that this PWR value could be the PWR value used for ramp up or the updated PWR value resultant from a saturation backoff event. Then, the outer digital loop is closed and transients occur. If the output of logic block 408 of FIG. 4 is determined as being greater than the UPPER value, then the UPPER value is re-loaded with the new value. Similarly, if the output of logic block 408 of FIG. 4 is less than the LOWER value, then the LOWER value is re-loaded. The difference, ('UPPER' value minus 'LOWER' value) is then monitored to determine whether the control loop is in a soft saturated mode.

A determination is then made as to whether either of the aforementioned saturation mechanisms, e.g. hard saturation or soft saturation, are enabled, as shown in step 815. If neither of the aforementioned saturation mechanisms are enabled in step 815, the process waits for the end of slot, as shown in step 820.

If either of the aforementioned saturation mechanisms are enabled in step 815, the process waits for a specified duration in step 825, to ensure that the target power has been reached and that the filtered version of Vd (as shown in FIG. 4) has had sufficient time to settle so that it can be loaded into an appropriate control loop register (not shown). The process then waits for either of the following events to occur: the hard saturation timer to expire or the soft saturation timer to expire, as shown in step 830. If the soft saturation timer has expired, then the perturbations are enabled as shown in step 835. The use of these timers adds to the robustness of the system if the soft saturation logic and hard saturation logic can be independently switched 'on' based on independent timers. If a positive edge of perturbations is detected, then the soft saturation measurement is reset as shown in step 840. A determination is then made as to whether the hard saturation timer has expired, as shown in step 845. If the hard saturation timer has expired, in step 845, a determination is made as to whether the digital loop is closed and the hard saturation has been enabled as shown in step 850.

If the digital loop is closed and the hard saturation has been enabled, in step 850, a determination is made as to whether the ramp voltage (Vramp) is less than a power threshold value, in step 855. If the ramp voltage (Vramp) is less than a power threshold value, in step 855, a hard saturation has been detected, the process then moves to step 905 of FIG. 9, where a power backoff may be instructed.

However, if the ramp voltage (Vramp) is not less than a power threshold value, in step 855, i.e. a hard saturation has not been detected, or the digital loop is not closed and the hard saturation determination logic has not been enabled, in step 850, or the hard saturation timer has not expired, in step 845, the process moves on to step 860. In step 860, a determination is made as to whether the soft saturation timer has expired. This timer allows soft saturation to be switched 'on', independently of hard saturation. A determination is made as to whether the digital loop is closed and the soft saturation determination logic enabled as shown in step 865.

If the digital loop is closed and the soft saturation determination logic has been enabled, in step 865, then if the voltage ramp (Vramp) is less than the lower output voltage level, then the lower output voltage level is set to Vramp. If the voltage ramp (Vramp) is greater than the upper output voltage level, then the upper output voltage level is set to Vramp, as shown in step 870. A determination is then made as to whether the upper output voltage level minus the lower output voltage level is greater than a threshold value, as shown in step 875. If the upper output voltage level minus the lower output voltage level is greater than a threshold value, in step 875, the process moves to step 910 of FIG. 9. As mentioned previously, the use of these thresholds and subsequent comparison operations assists determining the response to introduced perturbations. In one embodiment a peak-to-peak measurement is performed, with a running measurement of upper and lower codes being measured. Thus, if a difference between these codes is greater than a threshold then it indicates that the PA is operating in soft saturation. If the upper output voltage level minus the lower output voltage level is not greater than a threshold value, in step 875, the process moves to step 880, where a determination is made as to whether the transmission has reached the end of the slot. If the transmission has not reached the end of the slot in step 880, the process loops back to step 835. If the transmission has reached the end of the slot in step 880, a rampdown backoff operation is performed, as shown in step 885, and the process terminates.

Referring now to FIG. 9, the flowchart 900 illustrates extended flow operations of FIG. 8. In step 905, a power backoff value for hard saturation is set. Similarly, in step 910, a power backoff value for soft saturation is set; Following either step 905 or step 910, the digital loop is opened as shown in step 915. In step 920, the power regulator undergoes a back off operation. The maximum and minimum output power values are then re-set as shown in step 925. That is, in step 925, the soft saturation measurement is reset. In step 930, the process then waits a specified duration, which may be programmable and may be of the order of 5-10 μs into the active part of the slot, to allow the inner loop to settle. Thereafter, various parameters are loaded/programmed in the control loop to prime the outer digital loop so that it can be closed without creating any significant transient effect, as shown in step 935. The process then loops back to step 885 of FIG. 8.

It is to be understood that the architectures depicted herein are merely example of a, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected" or "operably coupled" to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A wireless communication unit comprising:
   a power amplifier;
   an inner feedback power control loop comprising a power control logic module, the power control logic module comprising a loop priming logic module operably coupled to the power amplifier; and
   a switchable outer digital loop comprising a switchable logic module; wherein
      the loop priming logic module is arranged to set a power reference value for controlling the power amplifier prior to a ramping operation of the power amplifier and prior to the switchable logic module switching the switchable outer digital loop on or off thereby restricting adverse transient behaviour of the power amplifier, and
      a transmitter of the wireless communication unit comprises the power amplifier, inner feedback power control loop, and switchable outer digital loop.

2. The wireless communication unit according to claim 1 wherein the power control logic module arranges for the inner loop to provide an initial output power leveling of the power amplifier during a ramp up operation.

3. The wireless communication unit according to claim 2 wherein the power control logic module arranges for the outer digital loop to remain in an open-loop mode of operation during the ramp up operation.

4. The wireless communication unit according to claim 1 wherein the power control logic module is configured to determine a latency of the outer digital loop and the switchable logic module is configured to switch the switchable outer digital loop on or off in response to the determined latency.

5. The wireless communication unit according to claim 4 wherein the power control logic module is further arranged to
   disable the outer digital loop; and
   perform a power backoff operation if the latency of the outer digital loop exceeds a threshold.

6. The wireless communication unit according to claim 5 wherein the power control logic module is further arranged to perform a power backoff operation by setting an inner loop power reference value for the power amplifier.

7. The wireless communication unit according to claim 6 wherein the power control logic module is further arranged to determine when the inner loop has settled and in response to the determination the loop priming logic module re-primes and re-engages the outer digital loop.

8. The wireless communication unit according to claim 1 wherein the loop priming logic module is further arranged to set the power reference value with a filtered version of a fed back detected signal coupled from the power amplifier.

9. The wireless communication unit according to claim 1 wherein the loop priming logic module is further arranged to prime both the inner loop and outer digital loop when switching between a closed loop operation and an open loop operation.

10. The wireless communication unit according to claim 1 wherein the outer digital loop is used for latency detection.

11. The wireless communication unit according to claim 1 wherein the power control logic module is arranged to add low-level perturbations to an outer digital loop reference when both the inner loop and the outer digital loop are engaged to determine whether the power amplifier is in a soft saturation mode of operation.

12. The wireless communication unit according to claim 11 further comprising:
   a Smith predictor loop, wherein
      the power control logic module is arranged to determine a loop latency based on the Smith predictor loop response to the added low-level perturbations.

13. The wireless communication unit according to claim 12 wherein the power control logic module is arranged to determine that the power amplifier is in a soft saturation mode of operation if a peak-to-peak transient response of the low-level perturbations exceeds a threshold level.

14. A method for power control of a power amplifier comprising an inner feedback power control loop and a switchable outer digital loop, the method comprising:
   engaging the inner feedback power control loop;
   engaging the switchable outer digital loop; and
   setting a power reference value for controlling the power amplifier prior to performing a ramping operation of the power amplifier and switching the switchable outer digital loop on or off, thereby restricting adverse transient behaviour of the power amplifier.

15. A semiconductor device for a transmitter that comprises a power amplifier, wherein the semiconductor device comprises:
   an inner feedback power control loop having a power control logic module wherein the power control logic module comprises a loop priming logic module for operably coupling to the power amplifier; and
   a switchable outer digital loop comprising a switchable logic module for operably coupling to the power amplifier, wherein the loop priming logic module is arranged to set a power reference value for controlling the power amplifier prior to a ramping operation of the power amplifier and the switchable logic module switching the switchable outer digital loop on or off, thereby restricting adverse transient behaviour of the power amplifier.

16. The semiconductor device according to claim 15 wherein the power control logic module arranges for the inner loop to provide an initial output power leveling of the power amplifier during a ramp up operation.

17. The semiconductor device according to claim 16 wherein the power control logic module arranges for the outer digital loop to remain in an open-loop mode of operation during the ramp up operation.

18. The semiconductor device according to claim 15 wherein the power control logic module is configured to determine a latency of the outer digital loop and the switchable logic module is configured to switch the switchable outer digital loop on or off in response to the determined latency.

19. The semiconductor device according to claim 15 wherein the loop priming logic module is further arranged to set the power reference value with a filtered version of a fed back detected signal coupled from the power amplifier.

20. The semiconductor device according to claim 15 wherein the loop priming logic module is further arranged to prime both the inner loop and outer digital loop when switching between a closed loop operation and an open loop operation.

* * * * *